United States Patent
Basceri et al.

(10) Patent No.: US 9,620,670 B2
(45) Date of Patent: Apr. 11, 2017

(54) SOLID STATE LIGHTING DIES WITH QUANTUM EMITTERS AND ASSOCIATED METHODS OF MANUFACTURING

(75) Inventors: Cem Basceri, Cary, NC (US); Casey Kurth, Boise, ID (US); Thomas Gehrke, Boise, ID (US); Kevin Tetz, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1175 days.

(21) Appl. No.: 12/874,360

(22) Filed: Sep. 2, 2010

(65) Prior Publication Data
US 2012/0056206 A1   Mar. 8, 2012

(51) Int. Cl.
| | |
|---|---|
| *H01L 21/77* | (2006.01) |
| *H01L 33/12* | (2010.01) |
| *H01L 33/00* | (2010.01) |
| *H01L 33/08* | (2010.01) |
| *H01L 33/02* | (2010.01) |

(52) U.S. Cl.
CPC ............ *H01L 33/007* (2013.01); *H01L 33/08* (2013.01); *H01L 33/02* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,981,975 A * | 11/1999 | Imhoff | 257/81 |
| 6,014,118 A | 1/2000 | Edwards et al. | |
| 6,329,667 B1 * | 12/2001 | Ota et al. | 257/13 |
| 6,399,964 B1 | 6/2002 | Corr | |
| 6,417,019 B1 * | 7/2002 | Mueller et al. | 438/29 |
| 7,316,874 B2 | 1/2008 | Blanchet-Fincher | |
| 2001/0045564 A1 * | 11/2001 | Koike et al. | 257/88 |
| 2005/0141577 A1 * | 6/2005 | Ueta et al. | 372/43 |
| 2005/0179130 A1 * | 8/2005 | Tanaka et al. | 257/730 |
| 2006/0105199 A1 | 5/2006 | Gerlach et al. | |
| 2006/0267026 A1 * | 11/2006 | Kim et al. | 257/79 |
| 2007/0085093 A1 * | 4/2007 | Ohmae et al. | 257/89 |
| 2007/0292979 A1 * | 12/2007 | Hata et al. | 438/22 |
| 2008/0156366 A1 * | 7/2008 | Kim et al. | 136/255 |
| 2008/0253421 A1 | 10/2008 | Charache et al. | |

(Continued)

OTHER PUBLICATIONS

Yang et al., "Selective area deposited blue GaN—InGaN multiple-quantum well light emitting diodes over silicon substrates",Jan. 2000, Applied Physics Letters, vol. 76, No. 3, pp. 273-275.*

(Continued)

*Primary Examiner* — Whitney T Moore
*Assistant Examiner* — Scott R Wilson
(74) *Attorney, Agent, or Firm* — Perkins Coie LLP

(57) ABSTRACT

Solid state lighting dies and associated methods of manufacturing are disclosed herein. In one embodiment, a solid state lighting die includes a substrate material, a first semiconductor material, a second semiconductor material, and an active region between the first and second semiconductor materials. The second semiconductor material has a surface facing away from the substrate material. The solid state lighting die also includes a plurality of openings extending from the surface of the second semiconductor material toward the substrate material.

3 Claims, 11 Drawing Sheets

(56) References Cited

U.S. PATENT DOCUMENTS

| | | | |
|---|---|---|---|
| 2008/0308823 A1* | 12/2008 | Kamii et al. ................... | 257/94 |
| 2009/0045394 A1* | 2/2009 | Smeeton et al. ............... | 257/13 |
| 2009/0179552 A1 | 7/2009 | Froehlich et al. | |
| 2009/0267098 A1* | 10/2009 | Choi .............................. | 257/98 |
| 2011/0114915 A1* | 5/2011 | Lee et al. ....................... | 257/13 |

OTHER PUBLICATIONS

"Substrate". (1992). In C. Morris (Ed.), Academic press Dictionary of science and technology. Oxford, United Kingdom: Elsevier Science & Technology. Retrieved from http://search.credoreference.com/content/entry/apdst/substrate/0.*

"Substrate". (1999). In S. Amos & R. Amos, Newnes Dictionary of electronics, newnes. Oxford, United Kingdom: Elsevier Science & Technology. Retrieved from http://search.credoreference.com/content/entry/bhelec/substrate/0.*

"Opening". (1992). In C. Morris (Ed.), Academic press Dictionary of science and technology. Oxford, United Kingdom: Elsevier Science & Technology. Retrieved from http://search.credoreference.com/content/entry/apdst/opening/0.*

* cited by examiner

SOLID STATE LIGHTING DIES WITH QUANTUM EMITTERS AND ASSOCIATED METHODS OF MANUFACTURING

TECHNICAL FIELD

The present technology is directed generally to solid state lighting ("SSL") devices with quantum emitters and associated methods of manufacturing.

BACKGROUND

SSL devices generally use semiconductor light emitting diodes ("LEDs"), organic light emitting diodes ("OLEDs"), laser diodes ("LDs"), and/or polymer light emitting diodes ("PLEDs") as sources of illumination rather than electrical filaments, a plasma, or a gas. FIG. 1 is a cross-sectional diagram of a portion of a conventional indium-gallium nitride ("InGaN") LED die 10. As shown in FIG. 1, the LED die 10 includes a substrate 12 (e.g., silicon carbide, sapphire, or silicon), an N-type gallium nitride ("GaN") material 14, an active region 16 (e.g., GaN/InGaN multi quantum wells ("MQWs")), and a P-type GaN material 18 on top of one another in series. The LED die 10 can also include a first contact 11 on the P-type GaN material 18 and a second contact 15 on the N-type GaN material 14.

The GaN/InGaN materials of the LED die 10 are generally formed via epitaxial growth and typically include a large number of crystal defects that can negatively impact the optical and/or electrical performance of the LED die 10. For example, FIG. 2 is a transmission electron microscopy ("TEM") image 20 of a GaN layer 24 formed on a sapphire substrate 22 via metal organic chemical vapor deposition ("MOCVD"). As shown in FIG. 2, the GaN layer 24 includes a plurality of threading dislocations 26 extending away from the substrate 22 into the GaN layer 24. It is believed that the threading dislocations 26 and/or other crystal defects can negatively impact the performance of LEDs. Accordingly, several improvements to reduce the negative impact of crystal defects in LEDs may be desirable.

DETAILED DESCRIPTION

Various embodiments of SSL devices and dies with quantum emitters and associated methods of manufacturing are described below. The term "microelectronic substrate" is used throughout to include substrates upon which and/or in which SSL dies, microelectronic devices, micromechanical devices, data storage elements, read/write components, and other features are fabricated. The term "lattice dislocation" generally refers to a crystallographic defect or irregularity within a crystal structure. A lattice dislocation can include an edge dislocation, a threading (or screw) dislocation, a V-defect, and/or a combination thereof. A person skilled in the relevant art will also understand that the technology may have additional embodiments, and that the technology may be practiced without several of the details of the embodiments described below with reference to FIGS. 3A-6B.

FIGS. 3A-3L are cross-sectional and top views of a portion of a microelectronic substrate 100 undergoing a process for forming an SSL die in accordance with embodiments of the technology. The SSL die can be an LED, an OLED, a LD, a PLED, and/or other suitable devices. In the following description, common acts and structures are identified by the same reference numbers. Even though only particular processing operations and associated structures are illustrated in FIGS. 3A-3L, in certain embodiments, the process can also include forming a lens, a mirror material, support structures, conductive interconnects, and/or other suitable mechanical/electrical components (not shown).

Figure 1:
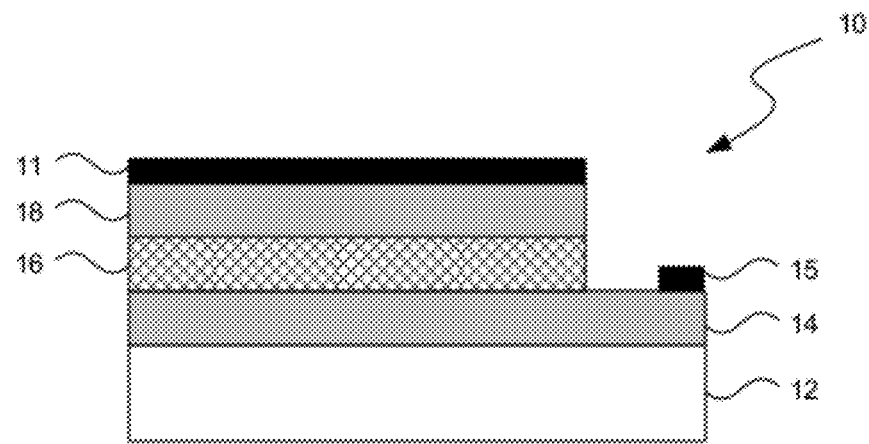
FIG. 1 is a cross-sectional view of a portion of an LED die in accordance with the prior art.
Figure 2:
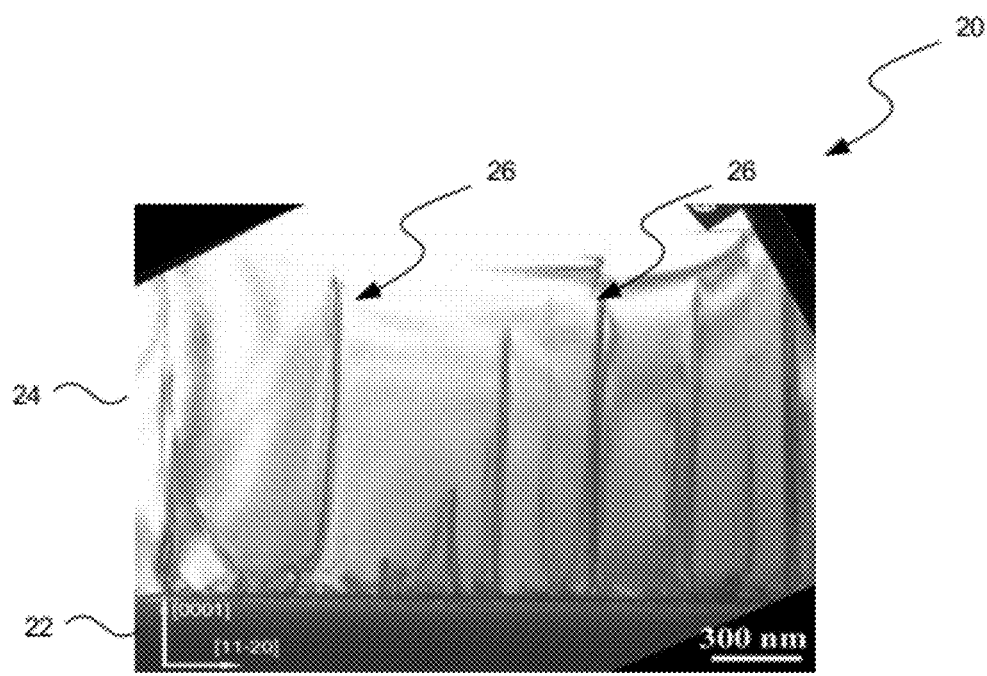
FIG. 2 is a TEM image of a portion of an LED die in accordance with the prior art.
Figure 3A:
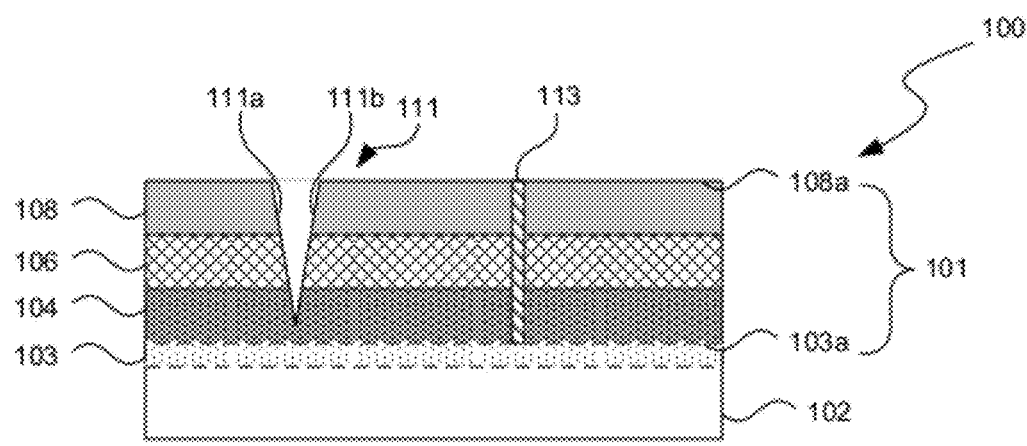
FIGS. 3A-3L are cross-sectional and top views of a portion of a microelectronic substrate undergoing a process for forming an SSL die in accordance with embodiments of the technology.

As shown in FIG. 3A, an initial operation of the process can include forming an SSL structure 101 and an optional buffer material 103 on a substrate material 102. The substrate material 102 can include a silicon (Si) wafer (e.g., with a Si(1,1,1) crystal orientation), aluminum gallium nitride (AlGaN), GaN, silicon carbide (SiC), sapphire ($Al_2O_3$), a combination of the foregoing materials, and/or other suitable substrate materials. In certain embodiments, the optional buffer material 103 can include aluminum nitride (AlN), GaN, zinc nitride (ZnN), and/or other suitable materials. In other embodiments, the optional buffer material 103 may be omitted, and the SSL structure 101 may be formed directly on the substrate material 102. In further embodiments, other suitable materials (e.g., zinc oxide ($ZnO_2$)) may be formed on the substrate material 102 in addition to or in lieu of the buffer material 103.

The SSL structure 101 can include a first semiconductor material 104, an active region 106, and a second semiconductor material 108 stacked one on the other. In one embodiment, the first and second semiconductor materials 104 and 108 include an N-type GaN material and a P-type GaN material, respectively. In another embodiment, the first and second semiconductor materials 104 and 108 include a P-type GaN material and an N-type GaN material, respectively. In further embodiments, the first and second semiconductor materials 104 and 108 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, InGaN/GaN MQWs, and/or an InGaN bulk material. In other embodiments, the active region 116 can include aluminum gallium indium phosphide (AlGaInP), aluminum gallium indium nitride (AlGaInN), and/or other suitable materials or configurations.

The SSL structure 101 and the optional buffer material 103 can be formed on the substrate 102 via MOCVD, molecular beam epitaxy ("MBE"), liquid phase epitaxy ("LPE"), hydride vapor phase epitaxy ("HVPE"), and/or other suitable epitaxial growth techniques. It has been observed, however, that the SSL structure 101 formed via the foregoing techniques typically includes a high density of lattice dislocations. For example, as shown in FIG. 3A, the SSL structure 101 can include an indentation defect 111 (commonly referred to as a "V-defect" due to its V-shaped cross-section) and a threading dislocation 113 laterally spaced apart from each other. Only one indentation defect 111 and one threading dislocation 113 are illustrated in FIG. 3A for illustration purposes. It is understood that the SSL structure 101 can include a plurality of indentations, threading dislocations, and/or other lattice dislocations (not shown).

The indentation defect 111 can include sidewalls 111a and 111b that extend at least partially into the SSL structure 101. In the illustrated embodiment, the sidewalls 111a and 111b extend from a semiconductor surface 108a of the second semiconductor material 108 into the first semiconductor material 104 and the active region 106. In other embodiments, the sidewalls 111a and 111b can extend into the active region 106 without extending into the first semiconductor material 104. In further embodiments, the sidewalls 111a and 111b can extend into the optional buffer material 103, and/or into the substrate material 102.

The threading dislocation 113 can extend at least partially between the optional buffer material 103 and the second semiconductor material 108. In the illustrated embodiment, the threading dislocation 113 is generally perpendicular to a buffer surface 103a of the optional buffer material 103. The threading dislocation 113 also extends the entire thickness between the buffer surface 103a and the semiconductor surface 108a. In other embodiments, the threading dislocation 113 may extend only partially between the buffer surface 103a and the semiconductor surface 108a. In further embodiments, the threading dislocation 113 may extend at an angle of other than 90° with respect to the buffer surface 103a. In yet further embodiments, the threading dislocation 113 may be joined (e.g., vertically) with the indentation defect 111 and/or may have other structures and/or configurations.

Without being bound by theory, it is believed that the indentation defect 111 and the threading dislocation 113 can negatively impact the optical and/or electrical performance of the SSL structure 101. For example, it is believed that the threading dislocation 113 can short circuit the active region 106 and/or cause current leakage in the SSL structure 101. It is also believed that impurities (e.g., carbon (C), oxygen (O), silicon (Si), and hydrogen (H)) tend to aggregate in the cores of the threading dislocation 113. Such impurities can cause non-radiated hole-electron recombination during operation, thus causing low optical efficiencies in the SSL structure 101. It is further believed that the indentation defect 111 can form carrier pathways that short circuit the SSL structure 101 when a conductive material (not shown) is formed on the second semiconductor material 108 as an electrical contact.

Figure 3B:
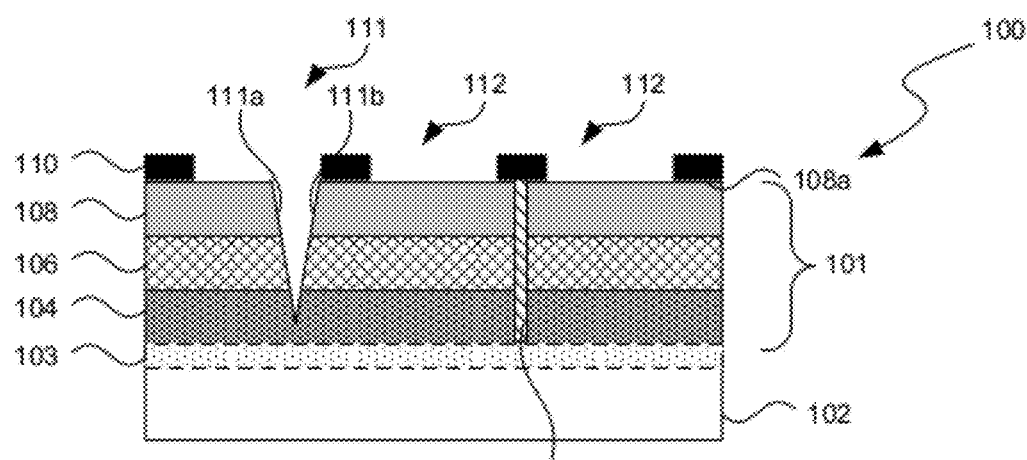
Figure 3C:
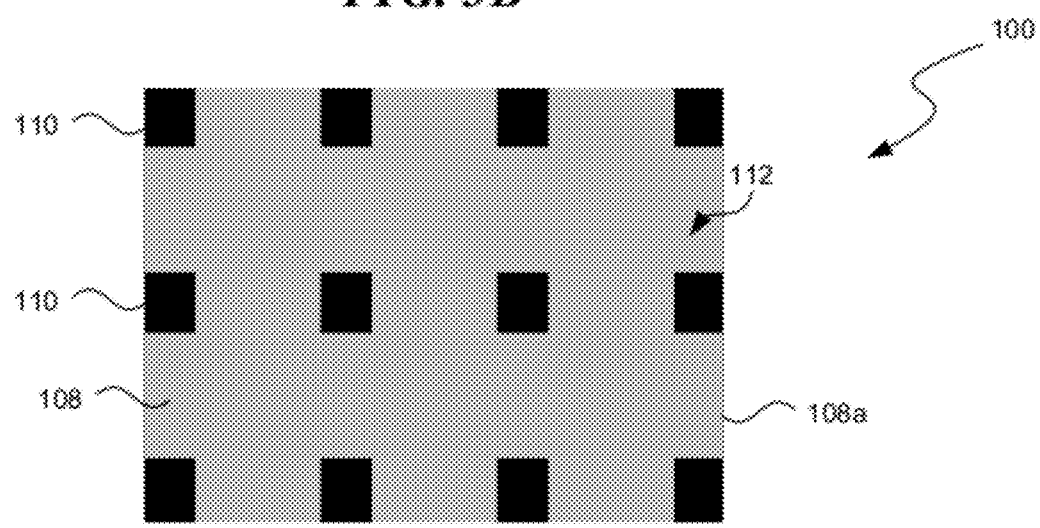

Several embodiments of the process can reduce or eliminate the negative impact of the indentation defect 111, the threading dislocation 113, and/or other lattice dislocations by forming a plurality of individual emitters on the SSL structure 101. FIG. 3B is a cross-sectional view and FIG. 3C is a top view of the microelectronic substrate 100 during an operation of the process. As shown in FIGS. 3B and 3C, a masking material 110 (e.g., a photoresist) can be formed on the semiconductor surface 108a of the second semiconductor material 108. The masking material 110 can then be patterned to define a plurality of mask openings 112 via photolithography and/or other suitable techniques. The mask openings 112 individually expose a portion of the semiconductor surface 108a.

Figure 3D:
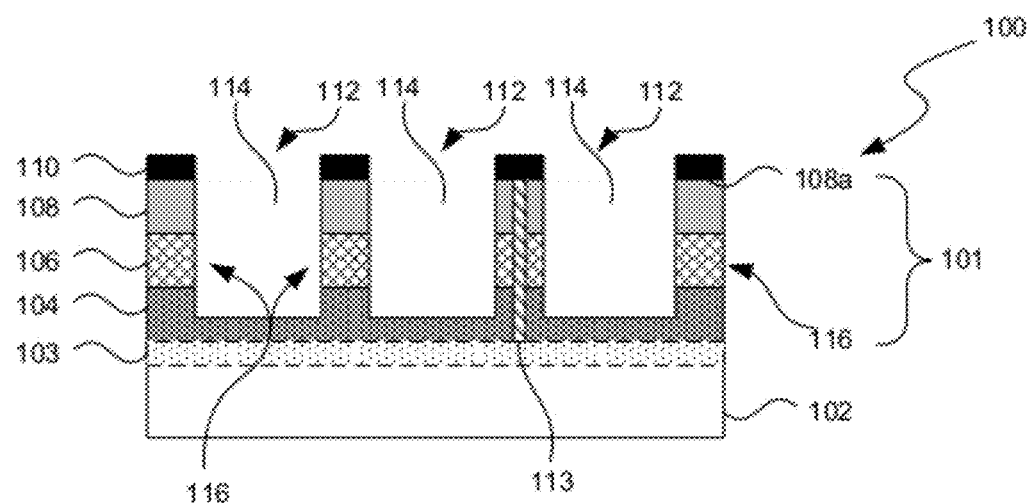
Figure 3E:
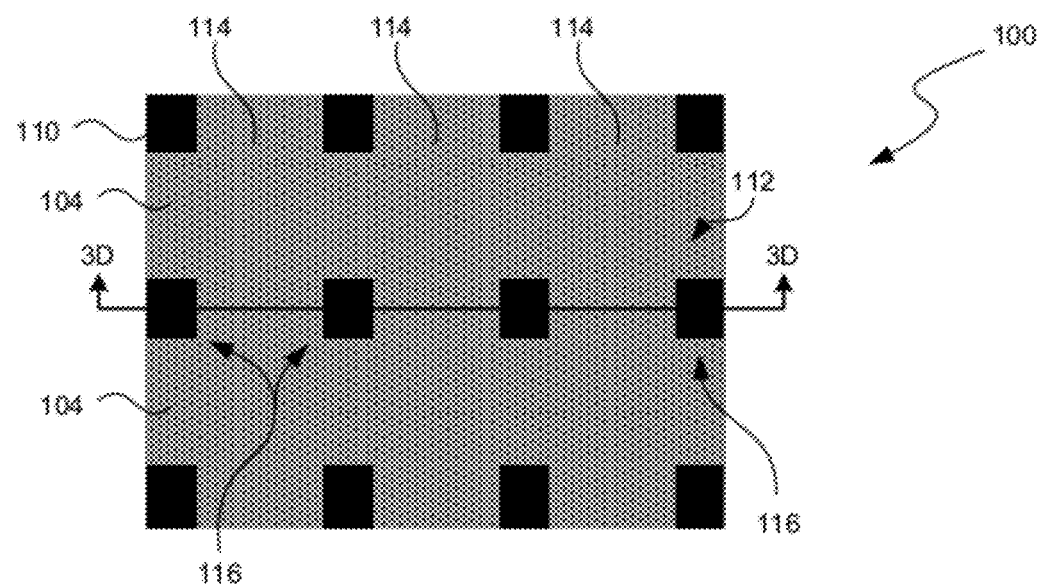
Figure 3F:
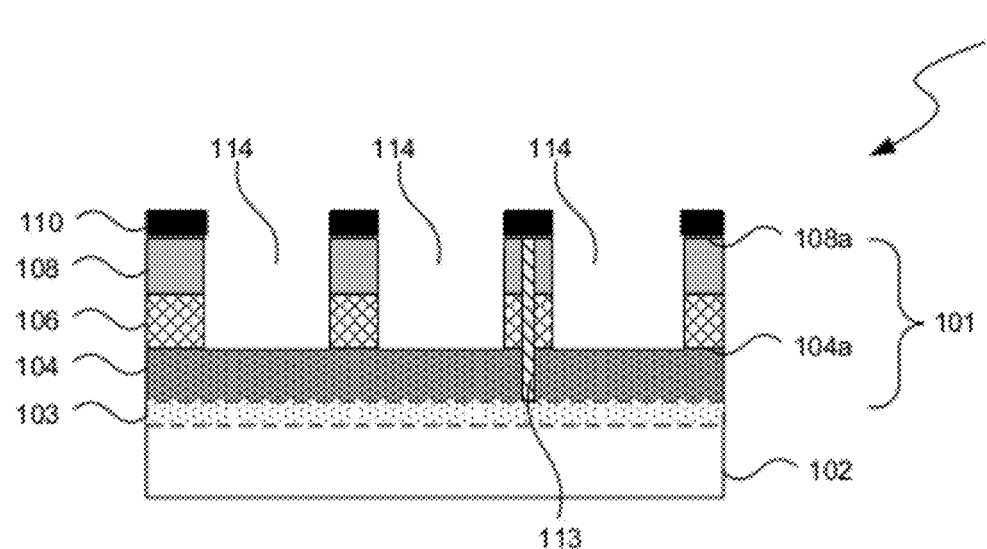
Figure 3G:
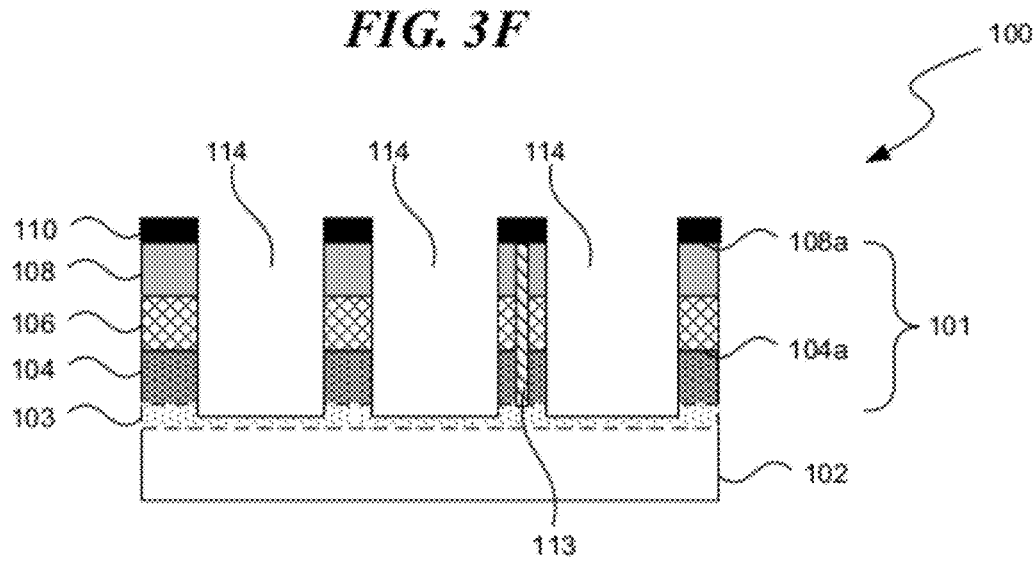
Figure 3H:
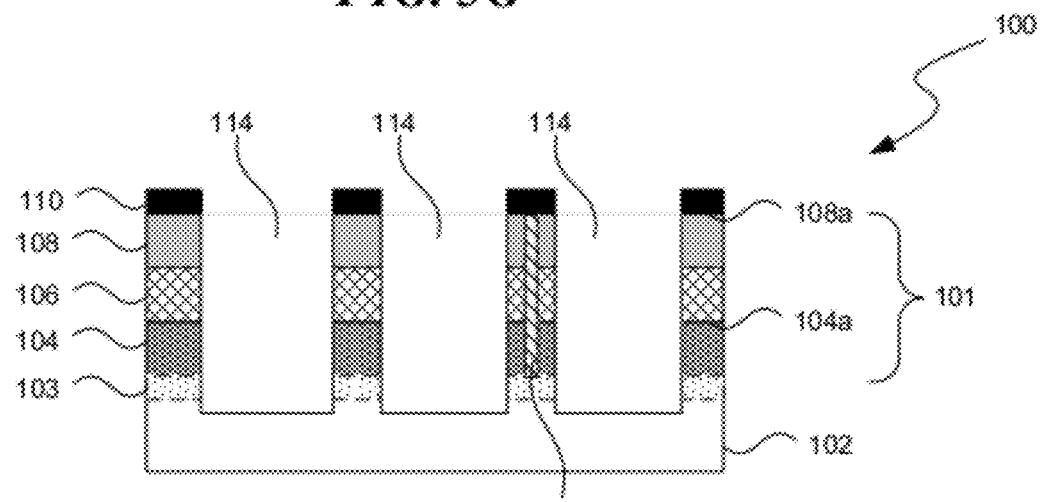

FIG. 3D is a cross-sectional view and FIG. 3E is a top view of the microelectronic substrate 100 during a subsequent operation of the process. As shown in FIGS. 3D and 3E, portions of the SSL structure 101 can be removed via the mask openings 112 in the masking material 110 to form a plurality of emitters 116 separated from one another by corresponding SSL openings 114. Suitable techniques for removing materials from the SSL structure 101 can include wet etching, dry etching, laser ablation, and/or other suitable techniques. In the illustrated embodiment, the SSL structure 101 is etched down into the first semiconductor material 104. In other embodiments, as shown in FIG. 3F, etching the SSL structure 101 may stop at a top surface 104a of the first semiconductor material 104. In further embodiments, the SSL structure 101 may be etched down into the optional buffer material 103 (as shown in FIG. 3G), and/or into the substrate material 102 (as shown in FIG. 3H).

Figure 3I:
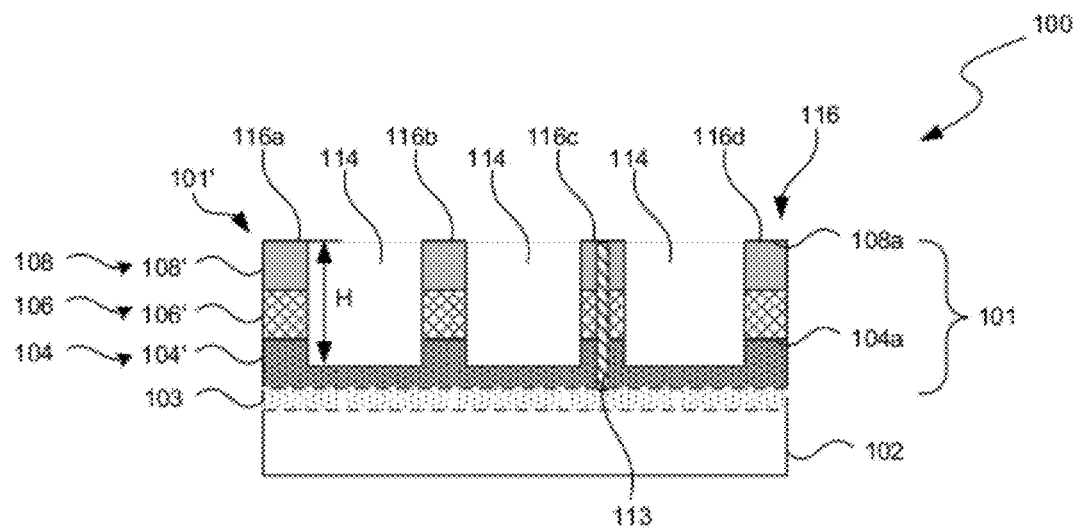
Figure 3J:
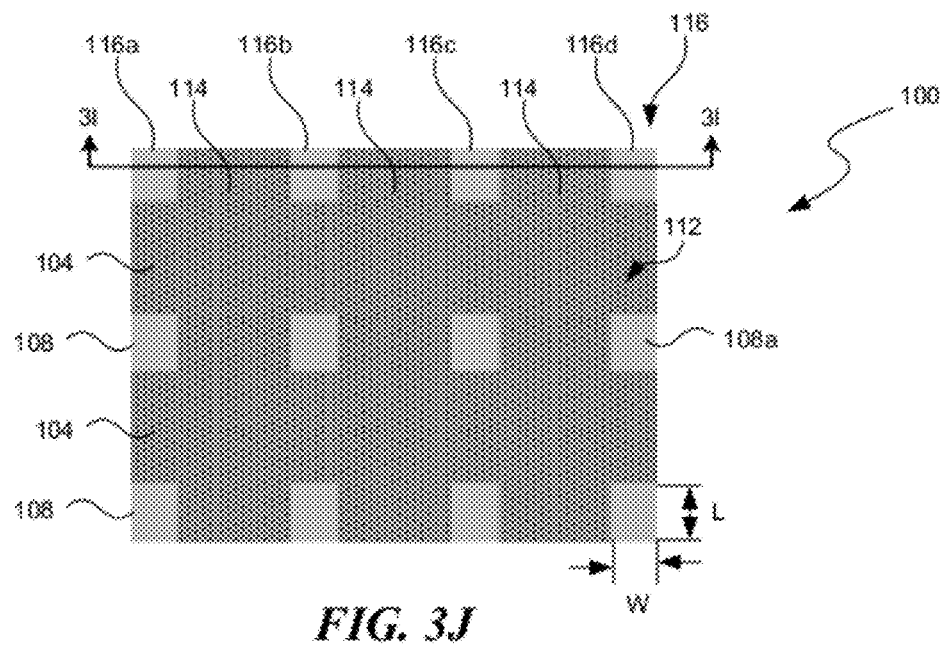

FIG. 3I is a cross-sectional view and FIG. 3J is a top view of the microelectronic substrate 100 during another operation of the process. As shown in FIGS. 3I and 3J, the masking material 110 (FIGS. 3D-3H) can be removed from the semiconductor surface 108a of the second semiconductor material 108 via wet etching, dry etching, and/or other suitable techniques. As shown in FIGS. 3I and 3J, the emitters 116 (identified individually first to fourth emitter 116a-116d, respectively, in FIG. 3I) can be arranged as an array (e.g., as a three-by-four array in FIG. 3J for illustration purposes). In other embodiments, the emitters 116 may be arranged radially in a circular pattern, in a semicircular pattern, and/or other suitable patterns (not shown). In further embodiments, the emitters 116 may be arranged in a combination of different arrays and/or patterns. In yet further embodiments, the emitters 116 may be arranged randomly on the microelectronic substrate 100.

The emitters 116 can individually include an active element 106' defined by the remaining portions of the active region 106 at the emitters 116, a second semiconductor element 108' defined by the remaining portions of the second semiconductor material 108 at the emitters 116, and optionally a first semiconductor element 104' defined by the remaining portions of the first semiconductor material 104. As such, in the illustrated embodiment, the emitters 116 individually include a first semiconductor element 104', an active element 106', and a second semiconductor element 108' that together form an SSL element 101'. In other embodiments, the emitters 116 can also include a portion of the buffer material 103 and/or the substrate material 102.

In certain embodiments, the emitters 116 can have generally similar shape, size, composition of material, and/or other suitable characteristics. For example, in the illustrated embodiment, the emitters 116 have a generally rectangular cross section with a length L (e.g., about 10 nanometers to about 50 nanometers) and a width W (e.g., about 10 nanometers to about 50 nanometers). The emitters 116 can also have a generally similar height H (e.g., about 50 nanometers to about 500 nanometers). The individual emitters 116 can include an N-type GaN first semiconductor element 104', InGaN MQWs, and a P-type GaN second semiconductor element 108'. In other embodiments, at least one of the length L, the width W, and the height H of at least one of the emitters 116 may have other suitable values different than other emitters 116. In further embodiments, at least one of the first semiconductor element 104', the active element 106', and the second semiconductor element 108' may have other suitable materials and/or configurations.

Without being bound by theory, it is believed that the emitters 116 with the foregoing dimensions have conducting characteristics that are closely related to the size and shape of the individual emitters 116. Generally, it is believed that emitters 116 with smaller sizes (e.g., cross-sectional area) have larger bandgaps. As a result, more energy is needed to excite electrons in the emitters 116 from a covalent bond to a conduction band. More energy is also released when the excited electrons return to the covalent bond from the conduction band. Thus, smaller emitters 116 can produce electromagnetic radiation in the visible spectrum at higher frequencies than larger emitters 116, resulting in a color shift from red to blue, which is commonly referred to as a "blue shift."

It is believed that the foregoing size dependency of emission characteristics is due at least in part to quantum confinement. Without being bound by theory, it is believed that the bandgap in a bulk material (e.g., with dimensions greater than about 100 nanometers) can be considered as having a fixed value because the dimensions of the bulk material are much larger than the average physical separation (commonly referred to as the "Bohr radius") between an excited electron and the corresponding hole (commonly referred to as "exciton"). However, when the size of the emitters 116 is sufficiently small (e.g., approaching or equal to the Bohr radius), the electron energy levels in the emitters 116 can no longer be considered continuous, but are instead discrete. The discrete energy levels thus limit the possible energy states that the electrons may be in, resulting in higher bandgap energies than in bulk materials.

Accordingly, the emission characteristics (e.g., peak emission frequencies) of the individual emitters 116 may be controlled by adjusting at least one of a size (e.g., the length L, the width W, the height H, and/or other suitable cross-sectional dimensions), a shape (e.g., a cross-sectional shape), a composition of the active element 106' (e.g., an indium percentage in InGaN SQW, MQWs, or a bulk material), and a configuration of the active element 106' (e.g., a thickness of material sub-layers in InGaN SQW, MQWs). For example, the cross-sectional size of the emitters 116 may be controlled by adjusting the size of the SSL openings 114. In another example, the composition and/or the configuration of the active element 106' may be controlled by adjusting at least one of a partial pressure of an indium precursor, a deposition temperature, and/or other suitable deposition parameters during MOCVD.

In certain embodiments, the SSL die may include emitters 116 configured to emit at different peak emission frequencies such that a combination of all the emissions produces a desired color appearance (e.g., white, blue, purple, etc.). For example, in one embodiment, the emitters 116 can include a first group and a second group of emitters 116. The first group can be configured to emit at a first peak frequency, and the second group can be configured to emit at a second peak frequency by having different size, shape, composition and/or configuration of the active element 106', and/or other suitable characteristics. When combined, the emissions from the first and second groups can appear white or another desired color to an average observer. In other embodiments, the emitters 116 can include three, four, or any desired number of groups that are configured to emit at different peak frequencies.

Figure 3K:
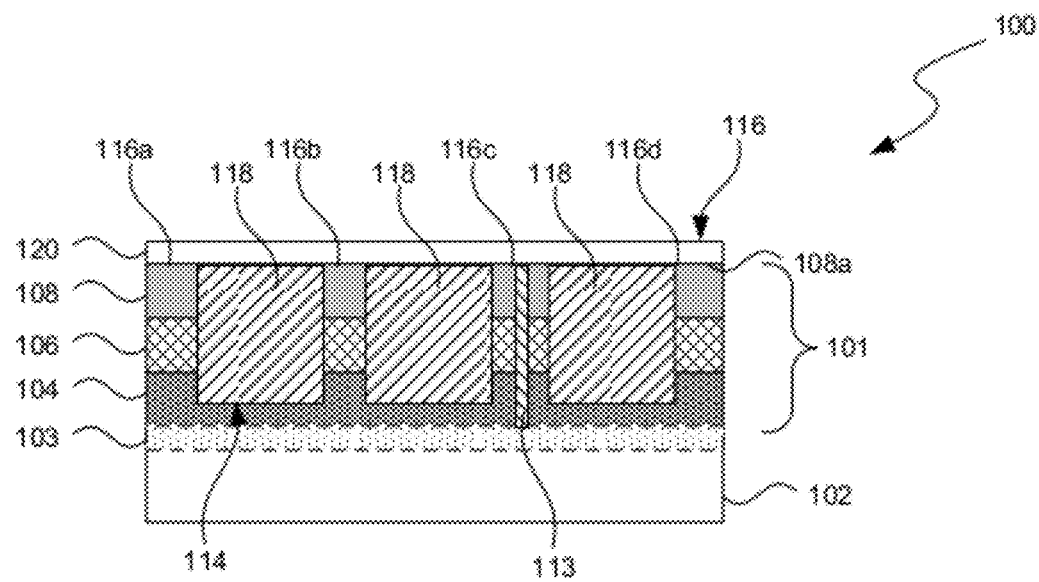
Figure 3L:
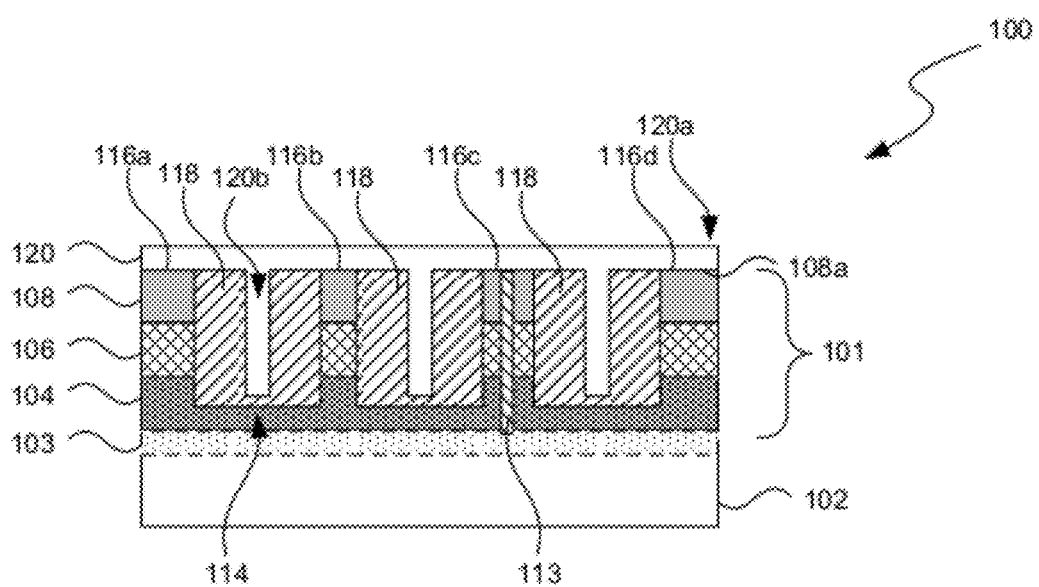

FIGS. 3K and 3L are cross-sectional views of the microelectronic substrate 100 during another operation of the process, in which a conductive material 120 is formed on the SSL structure 101. In certain embodiments, the conductive material 120 can include indium tin oxide ("ITO"), aluminum zinc oxide ("AZO"), fluorine-doped tin oxide ("FTO"), and/or other suitable transparent conductive oxide ("TCOs"). In other embodiments, the conductive material 120 can include copper (Cu), aluminum (Al), silver (Ag), gold (Au), platinum (Pt), and/or other suitable metals. In further embodiments, the conductive material 120 can include a combination of TCOs and one or more metals. Techniques for forming the conductive material 120 can include MOCVD, MBE, spray pyrolysis, pulsed laser deposition, sputtering, electroplating, and/or other suitable deposition techniques.

In certain embodiments, as shown in FIG. 3K, the process can include substantially filling the SSL openings 114 with an insulating material 118 and subsequently forming the conductive material 120 on the semiconductor surface 108a of the second semiconductor material 108 and the insulating material 118. The insulating material 118 can include silicon dioxide ($SiO_2$), silicon nitride (SiN), hafnium silicate ($HfSiO_4$), zirconium silicate ($ZrSiO_4$), hafnium dioxide ($HfO_2$), zirconium dioxide ($ZrO_2$), aluminum oxide ($Al_2O_3$), and/or other suitable transparent materials with a dielectric constant higher than about 1.0 at 20° C. under 1 kHz. Techniques for forming the insulating material 118 can include chemical vapor deposition ("CVD"), atomic layer deposition ("ALD"), spin-on coating, thermal oxidation, and/or other suitable techniques.

In other embodiments, as shown in FIG. 3L, the insulating material 118 can generally conform to the neighboring emitters 116 without substantially filling the SSL openings 114. As a result, the conductive material 120 includes a first conductive portion 120a on the semiconductor surface 108a of the second semiconductor material 108 and a second portion 120b in the SSL openings 114. In further embodiments, the conductive material 120 and/or the insulating material 118 may have other suitable configurations.

The SSL die formed in accordance with several embodiments of the foregoing process can at least reduce the density of lattice dislocations relative to the whole surface area of the SSL structure 101 when compared to conventional devices. For example, as shown in FIGS. 3B, 3D, and 3I, at least a portion of the indentation defect 111 can be removed from the SSL structure 101 when portions of the SSL structure 101 are removed from the SSL structure 101. In other embodiments, at least a portion of the threading dislocation 113 and/or other crystal dislocations may also be removed. As a result, the SSL structure 101 may have a lower density of lattice dislocations than conventional devices.

The SSL die formed in accordance with several embodiments of the foregoing process can also localize the negative impact of threading dislocations and/or other lattice dislocations. In conventional devices, threading dislocations can affect a large portion of an SSL structure by reducing the current density passing therethrough or completely short circuiting the SSL structure. In contrast, in the SSL structure 101 formed in accordance with several embodiments of the foregoing process, such an effect is at least reduced. For example, as shown in FIGS. 3K and 3L, when an electrical voltage is applied across the individual emitters 116, the threading dislocation 113 associated with the third emitter 116c may reduce a current density in or short circuit the third emitter 116c. However, the threading dislocation 113 does not affect the first, second, or fourth emitters 116a, 116b, and 116d because the third emitter 116c and the threading dislocation 113 are electrically insulated from the other emitters 116. As a result, the negative impact of the threading dislocation 113 may be localized.

The SSL die formed in accordance with several embodiments of the foregoing process can also have higher optical efficiencies when compared to conventional devices. As shown in FIGS. 3K and 3L, the individual emitters 116 have a three dimensional configuration instead of a two dimensional configuration, as in conventional devices. As a result, the individual emitters 116 have a reduced planar top surface area when compared to conventional devices. Thus, more light may escape from the emitters 116 by forming angles greater than an angle of internal reflection with the sides of the emitters 116.

FIGS. 4A-4D are cross-sectional and top views of a portion of the microelectronic substrate 100 undergoing another process for forming an SSL die in accordance with the embodiments of the technology. In the following description, certain operations of the process and structures of the SSL die can be generally similar to those discussed above with reference to FIGS. 3A-3I. As such, only significant differences are described below.

Figure 4A:
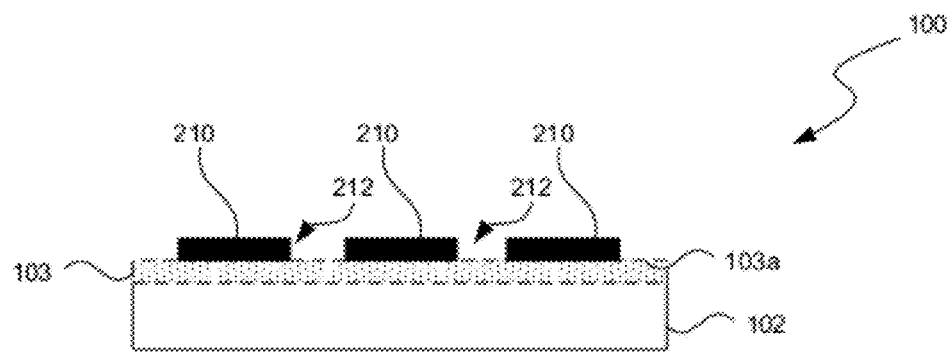
FIGS. 4A-4D are cross-sectional and top views of a portion of a microelectronic substrate undergoing another process for forming an SSL die in accordance with embodiments of the technology.
Figure 4B:
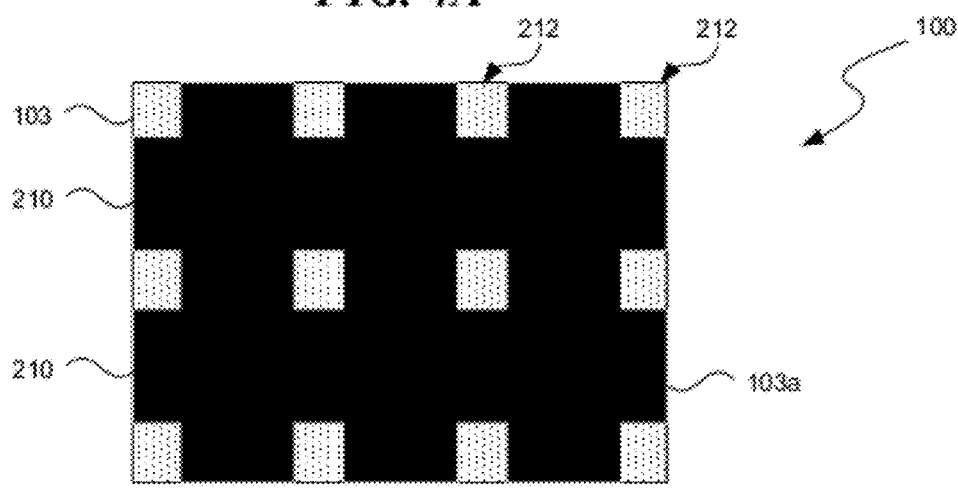

FIG. 4A is a cross-sectional view and FIG. 4B is a top view of the microelectronic substrate 100 during an initial operation of the process. As shown in FIGS. 4A and 4B, a shielding material 210 is formed on the buffer surface 103a of the optional buffer material 103. Portions of the shielding material 210 are removed to form a plurality of shielding openings 212. In the illustrated embodiment, the shielding openings 212 are arranged as an array on the microelectronic substrate 100. In other embodiments, the shielding openings 212 can also be arranged in a circular, semi-circular, and/or other suitable patterns. In further embodiments, the shielding openings 212 may be arranged randomly on the microelectronic substrate 100.

In certain embodiments, the shielding material 210 can include a photoresist that may be patterned via photolithography. In other embodiments, the shielding material 210 can include silicon dioxide ($SiO_2$), silicon nitride (SiN), and/or other suitable materials. Forming the shielding openings 212 can include depositing a photoresist (not shown) onto the shielding material 210, patterning the photoresist, and partially removing the shielding material 210 to form the shielding openings 212 via wet etch, dry etch, or other suitable techniques. In further embodiments, the shielding material 210 may include other suitable materials.

Figure 4C:
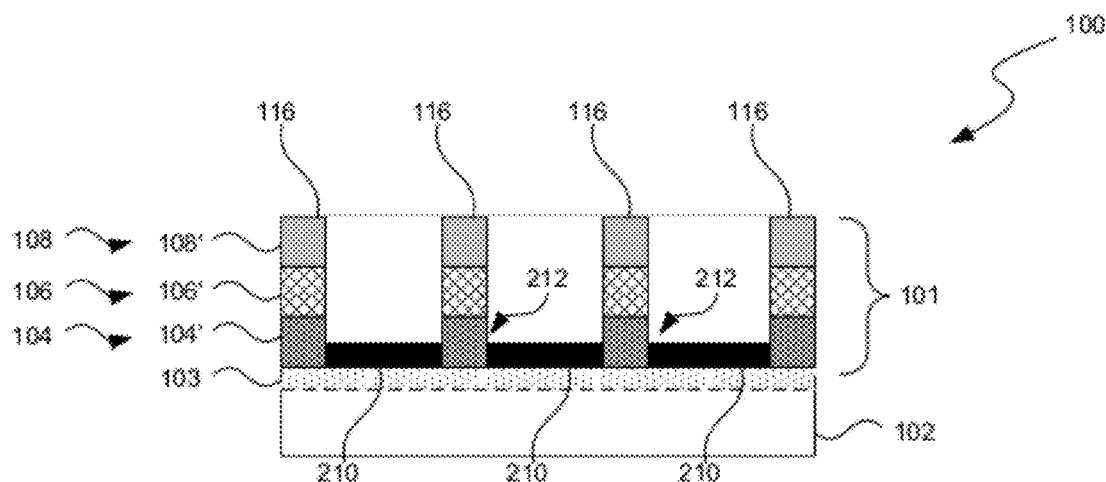

FIG. 4C shows another operation of the process, in which the first semiconductor material 104, the active region 106, and the second semiconductor material 108 are formed on the optional buffer material 103 via the shielding openings 212 in the shielding material 210. Without being bound by theory, it is believed that the first and second semiconductor materials 104 and 108 and the active region 106 can preferentially grow on the optional buffer material 103 because the foregoing materials 104, 106, and 108 would not readily nucleate on the shielding material 210. As a result a plurality of emitters 116 with a first semiconductor element 104', an active element 106', and a second semiconductor element 108' can be formed on the microelectronic substrate 100 via the shielding openings 212.

Figure 4D:
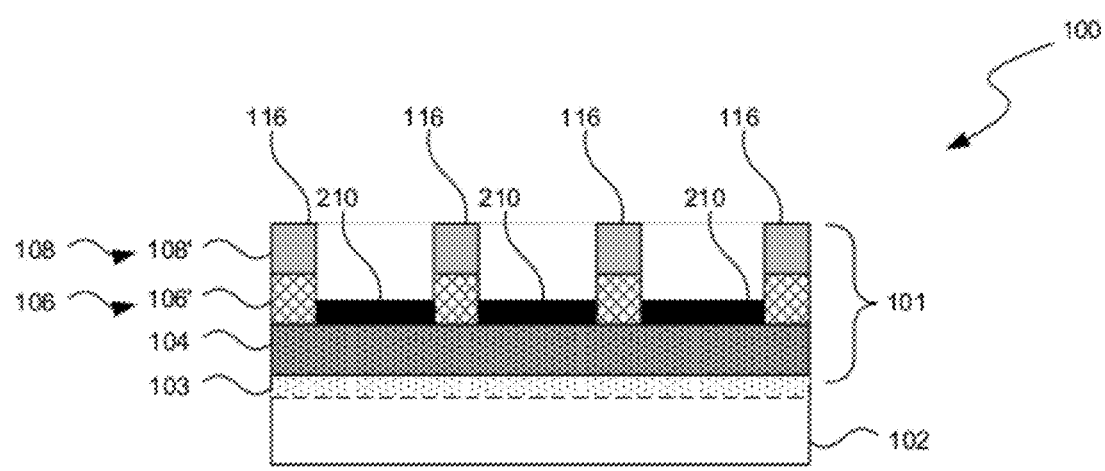

Even though the shielding material 210 is shown in FIGS. 4A-4C as being formed on the optional buffer material 103 before forming the SSL structure 101, FIG. 4D shows another embodiment in which the shielding material 210 is formed on the first semiconductor material 104 before the active region 106 and the second semiconductor material 108 are formed. As a result, the individual emitters 116 of this alternative embodiment can also include a portion of the first semiconductor material 104, the active element 106', and the second semiconductor element 108'. In any of the foregoing embodiments, after forming the emitters 116, the shielding material 210 may be removed from the microelectronic substrate 100. Subsequently, the conductive material 120 (shown in FIGS. 3K and 3L) may be formed on the SSL structure 101, as discussed in detail with reference to FIGS. 3K and 3L.

Figure 5A:
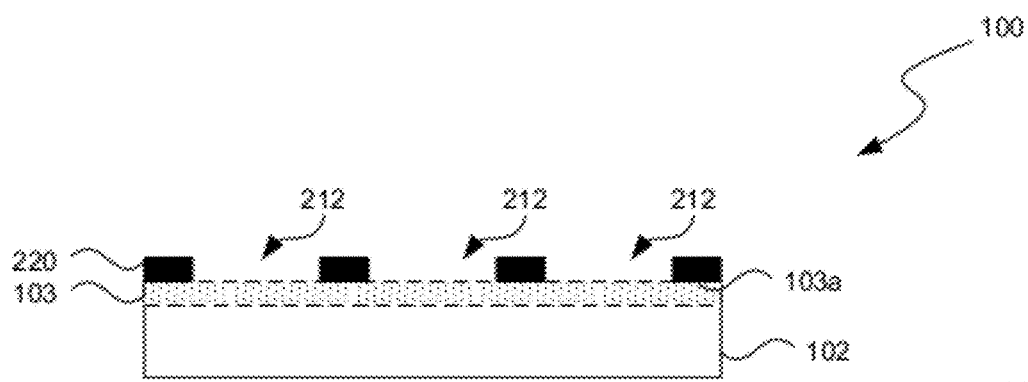
FIGS. 5A-5F are cross-sectional views of a portion of a microelectronic substrate undergoing another process for forming an SSL die in accordance with embodiments of the technology.

FIGS. 5A-5E are cross-sectional views of a portion of a microelectronic substrate 100 undergoing another process for forming an SSL die in accordance with embodiments of the technology. As shown in FIG. 5A, an initial operation of the process can include forming a photoresist 220 on the buffer surface 103a of the optional buffer material 103 and subsequently patterned to form the plurality of shielding openings 212 via photolithography.

Figure 5B:
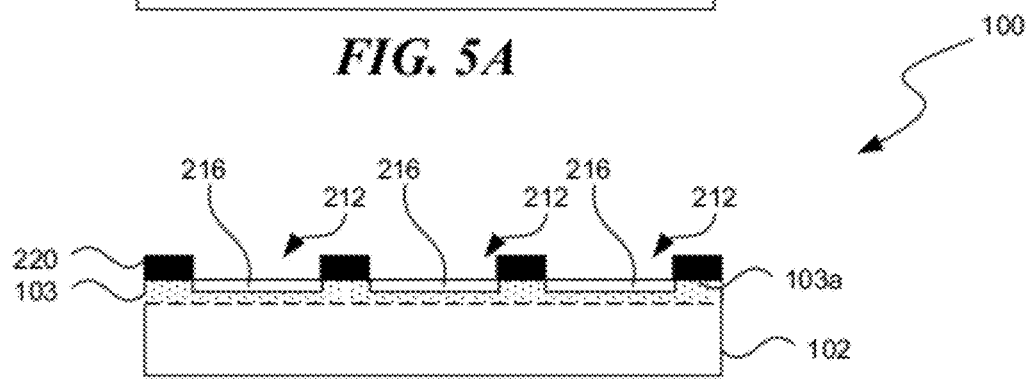

As shown in FIG. 5B, a subsequent operation of the process can include removing at least a portion of the optional buffer material 103 through the shielding openings 212 to form indentations 216. Techniques for removing the optional buffer material 103 can include wet etching, dry etching, and/or other suitable material removal techniques. In the illustrated embodiments, the optional buffer material 103 is partially removed through the shielding openings 212. In other embodiments, the optional buffer material 103 can be completely removed through the shielding openings 212. In further embodiments, the optional buffer material 103 may be completely removed along with underlying materials, for example, the substrate material 102 through the shielding openings 212.

Figure 5C:
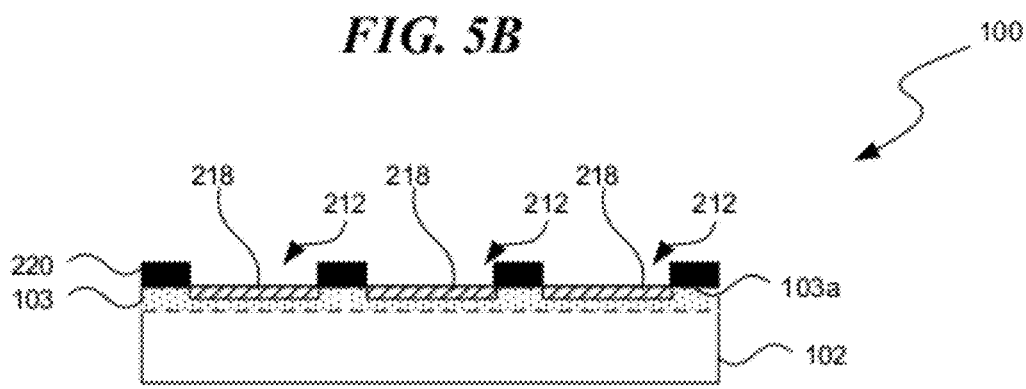

As shown in FIG. 5C, another operation of the process can include depositing an insulating material 218 into the indentations 216. The insulating material 218 can include silicon dioxide ($SiO_2$), silicon nitride (SiN), and/or other suitable insulating materials. In the illustrated embodiment the deposited insulating material 218 is generally coplanar with the buffer surface 103a of the buffer material 103. In other embodiments, the insulating material 218 may be offset from the buffer surface 103a of the optional buffer material 103. In further embodiments in which the buffer material 103 is omitted, the indentations 216 and the insulating material 218 may be formed in the substrate material 102.

Figure 5D:
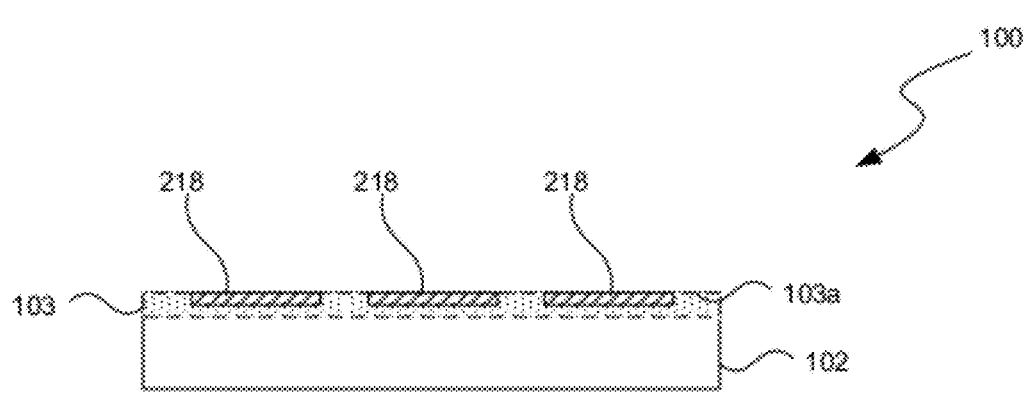
Figure 5E:
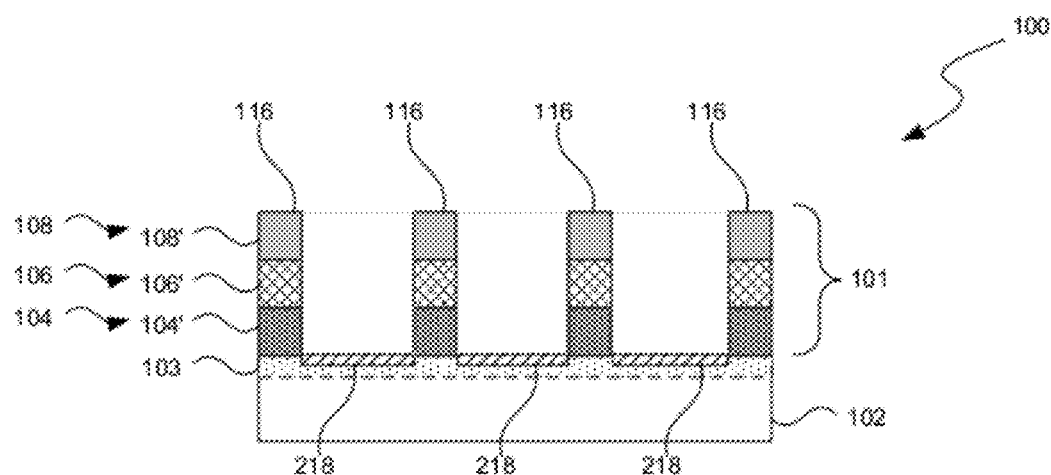
Figure 5F:
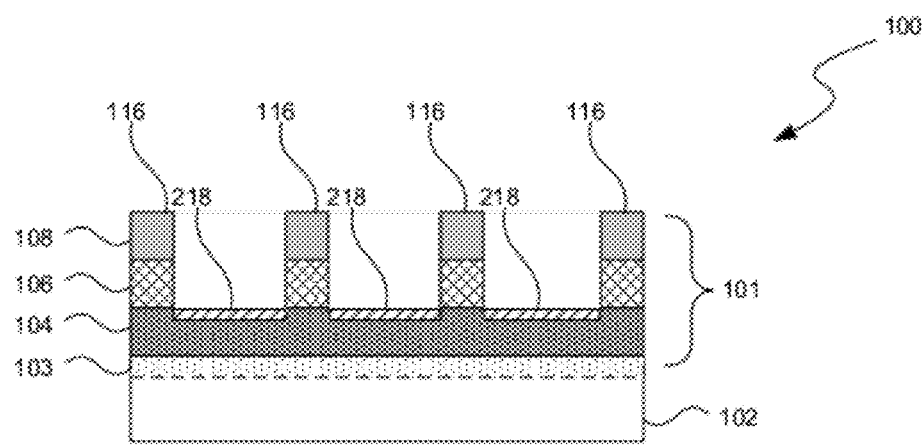

As shown in FIG. 5D, a subsequent operation of the process includes removing the photoresist 220 from the microelectronic substrate 100. As shown in FIG. 5E, the SSL structure 101 having the first semiconductor material 104, the active region 106, and the second semiconductor material 108 can be formed on the optional buffer material 103. Without being bound by theory, it is believed that the first and second semiconductor materials 104 and 108 and the active region 106 can preferentially form on the optional buffer material 103 because the foregoing materials 104, 106, and 108 would not readily nucleate on the insulating material 218. As a result, the plurality of emitters 116 with individual first semiconductor element 104', active element 106', and second semiconductor element 108' can be formed on the microelectronic substrate 100 via the shielding openings 212.

Even though the insulating material 218 is shown above as formed in the optional buffer material 103, the insulating material 218 can also be formed in the first semiconductor material 104 prior to forming the active region 106 and the second semiconductor material 108 (FIG. 5). After forming the emitters 116, the process can include forming the conductive material 120 (shown in FIGS. 3K and 3L) on the SSL structure 101, as discussed above with reference to FIGS. 3K and 3L.

Figure 6A:
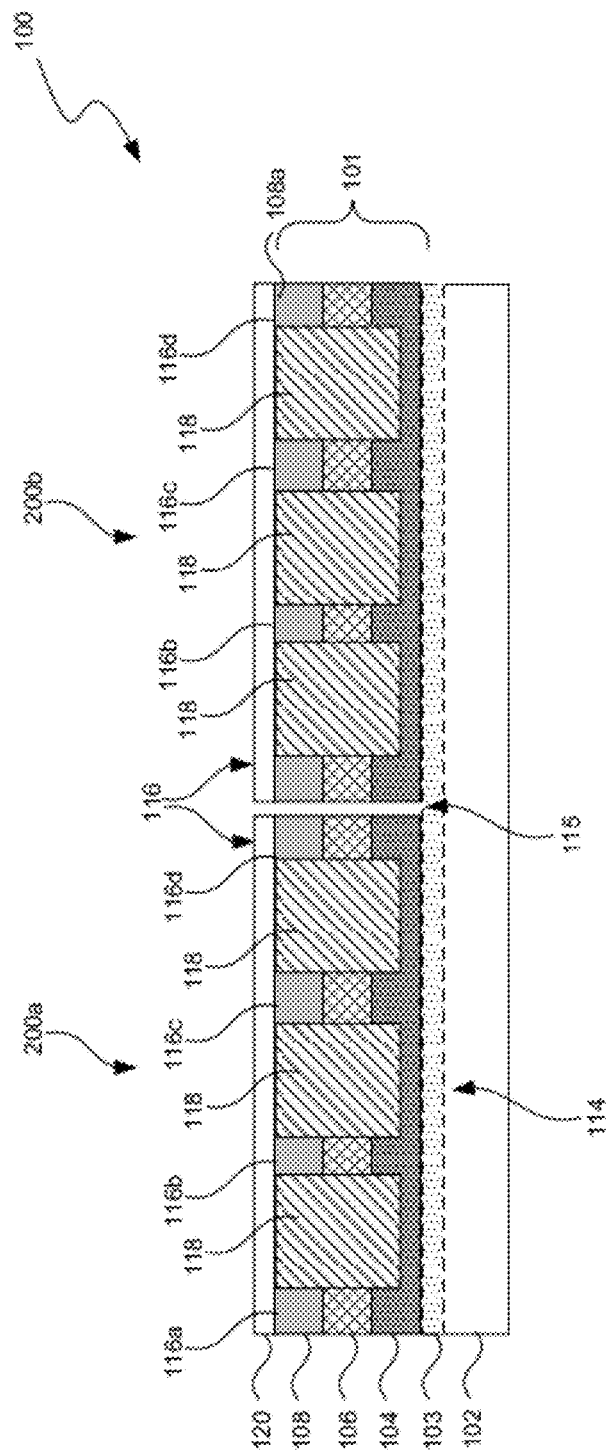
FIG. 6A is a cross-sectional view of a portion of a microelectronic substrate 100 during a processing stage for forming a plurality of SSL dies 200 in accordance with embodiments of the technology

In the embodiments discussed above with reference to FIGS. 3A-5F, only one SSL die is formed in the microelectronic substrate 100. In other embodiments, a plurality of SSL dies may be formed in the microelectronic substrate 100 at the same time following generally similar processing stages. FIG. 6A is a cross-sectional view of a portion of a microelectronic substrate 100 during a processing stage for forming a plurality of SSL dies 200 in accordance with embodiments of the technology. In the illustrated embodiment, a plurality of SSL dies 200 (identified individually as first and second SSL dies 200a and 200b, respectively) are formed in the microelectronic substrate 100. Even though only two SSL dies 200 are illustrated in FIG. 6A, in other embodiments, three, four, or any other desired number of SSL dies 200 may be formed in the microelectronic substrate 100.

As shown in FIG. 6A, a gap 115 separates the first and second SSL dies 200a and 200b, which are generally similar to the SSL die discussed above with reference to FIG. 3K. In other embodiments, the SSL dies 200a and 200b can individually have structures and functions generally similar to other embodiments of the SSL die discussed above with reference to FIGS. 3A-5F. The first and second SSL dies 200a and 200b may be formed simultaneously or formed in sequence. In certain embodiments, the gap 115 may be formed by etching, laser ablation, saw cutting, and/or other suitable techniques subsequent to forming the first and second SSL dies 200a and 200b. In other embodiments, the gap 115 may be formed via other suitable techniques. Subsequent to forming the SSL dies 200, the individual SSL dies 200 may be singulated along the gap 115. The singulated SSL dies 200 can be assembled into an SSL device, an example of which is discussed below with reference to FIG. 6B.

Figure 6B:
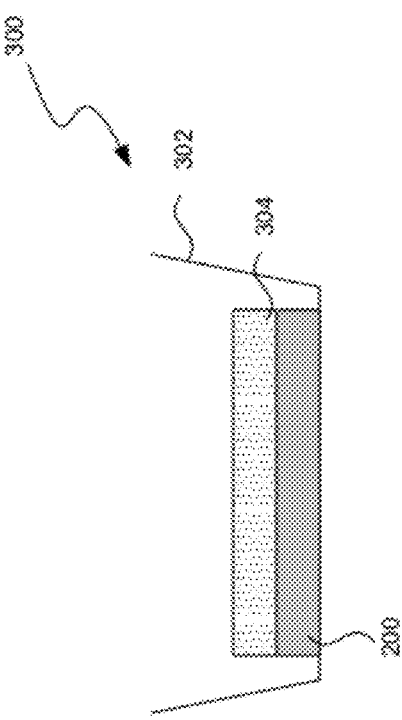
FIG. 6B is a cross-sectional view of an SSL device incorporating an SSL die with quantum emitters in accordance with embodiments of the technology.

FIG. 6B is a cross-sectional view of an SSL device 300 incorporating an SSL die 200 with quantum emitters in accordance with embodiments of the technology. As shown in FIG. 6B, the SSL device 300 can include a support structure 302 holding the SSL die 200 and a converter material 304 disposed on the SSL die 200. The SSL die 200 can have structures and functions generally similar to any of the embodiments discussed above with reference to FIGS. 3A-5F.

The support structure 302 can include any suitable structure for carrying and/or otherwise holding the SSL die 200 and the converter material 304. In certain embodiments, the support structure 302 can be constructed from silicon (Si), gallium nitride (GaN), aluminum nitride (AlN), and/or other suitable semiconductor materials. In other embodiments, the support structure 302 can be constructed from copper (Cu), aluminum (Al), tungsten (W), stainless steel, and/or other suitable metal and/or metal alloys. In further embodiments, the support structure 302 can be constructed from diamond, glass, quartz, silicon carbide (SiC), aluminum oxide ($Al_2O_3$), and/or other suitable crystalline or ceramic materials.

The converter material 304 can be configured to emit at a desired wavelength under stimulation such that a combination of the emission from the SSL die 200 and from the converter material 304 can emulate a target color (e.g., white light). For example, in one embodiment, the converter material 304 can include a phosphor containing cerium(III)-doped yttrium aluminum garnet (YAG) at a particular concentration for emitting a range of colors from green to yellow and to red under photoluminescence. In other embodiments, the converter material 304 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable phosphor compositions. In yet other embodiments, the converter material 106 can include europium phosphors (e.g., CaS:Eu, $CaAlSiN_3$:Eu, $Sr_2Si_5N_8$:Eu, SrS:Eu, $Ba_2Si_5N_8$:Eu, $Sr_2SiO_4$:Eu, $SrSi_2N_2O_2$:Eu, $SrGa_2S_4$:Eu, $SrAl_2O_4$:Eu, $Ba_2SiO_4$:Eu, $Sr_4All_4O_{25}$:Eu, $SrSiAl_2O_3N$:Eu, $BaMgAl_{10}O_{17}$:Eu, $Sr_2P_2O_7$:Eu, $BaSO_4$:Eu, and/or $SrB_4O_7$:Eu).

Even though the converter material 304 is shown in FIG. 6B as only covering the top surface of the SSL die 200, in other embodiments, the converter material 304 can also cover side surfaces of the SSL die 200. In further embodiments, the SSL device 300 can also include lenses, wire bonds, and/or other suitable optical, electrical, and/or mechanical components. In yet further embodiments, the converter material 304 may be omitted.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A method for forming a solid state lighting die, comprising:
   forming a buffer material on a substrate material;
   forming a masking material on the buffer material such that the buffer material is between the masking material and the substrate material, the masking material including a plurality of openings individually exposing a portion of the buffer material;
   removing the portion of the buffer material and a portion of the substrate material underlying the portion of the buffer material through the openings, thereby creating a plurality of indentations in the substrate material;
   depositing an insulating material into the indentations in the substrate material; and
   thereafter, forming an active region on the buffer material with the insulating material in the indentations.

2. The method of claim 1, further comprising removing the masking material from the substrate material after the insulating material is deposited into the indentations.

3. The method of claim 1 wherein:
   the method further comprises removing the masking material from the substrate material after the insulating material is deposited into the indentations; and
   forming the active region includes forming a plurality of active elements separated from one another by the insulating material in the indentations.

* * * * *